(12) United States Patent
Lee et al.

(10) Patent No.: US 10,388,726 B2
(45) Date of Patent: Aug. 20, 2019

(54) ACCUMULATION ENHANCED INSULATED GATE BIPOLAR TRANSISTOR (AEGT) AND METHODS OF USE THEREOF

(71) Applicant: SEMICONDUCTOR COMPONENTS INDUSTRIES, LLC, Phoenix, AZ (US)

(72) Inventors: Meng-Chia Lee, Chubbuck, ID (US); Ralph N. Wall, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/792,238

(22) Filed: Oct. 24, 2017

(65) Prior Publication Data

US 2019/0123136 A1   Apr. 25, 2019

(51) Int. Cl.

| H01L 29/06 | (2006.01) |
|---|---|
| H01L 29/08 | (2006.01) |
| H01L 29/10 | (2006.01) |
| H01L 29/167 | (2006.01) |
| H01L 29/40 | (2006.01) |
| H01L 29/66 | (2006.01) |
| H01L 29/739 | (2006.01) |
| H01L 21/265 | (2006.01) |
| H01L 21/324 | (2006.01) |

(52) U.S. Cl.
CPC .... *H01L 29/0634* (2013.01); *H01L 21/26513* (2013.01); *H01L 21/26526* (2013.01); *H01L 21/324* (2013.01); *H01L 29/0638* (2013.01); *H01L 29/0834* (2013.01); *H01L 29/1095* (2013.01); *H01L 29/167* (2013.01); *H01L 29/401* (2013.01); *H01L 29/407* (2013.01); *H01L 29/408* (2013.01); *H01L 29/66348* (2013.01); *H01L 29/7397* (2013.01)

(58) Field of Classification Search
CPC ............ H01L 29/0634; H01L 29/0638; H01L 29/0834; H01L 29/1095; H01L 29/167; H01L 29/401; H01L 29/407; H01L 29/408; H01L 29/66348; H01L 29/7397; H01L 21/26513; H01L 21/26526; H01L 21/324
USPC ......................................................... 257/143
See application file for complete search history.

(56) References Cited

U.S. PATENT DOCUMENTS

| 2003/0042537 A1* | 3/2003 | Nakamura | ............ H01L 29/402 257/328 |
|---|---|---|---|
| 2008/0012040 A1* | 1/2008 | Saito | .................... H01L 29/0696 257/133 |
| 2008/0197379 A1* | 8/2008 | Aono | ................... H01L 29/0834 257/133 |

(Continued)

OTHER PUBLICATIONS

T. Arai et al., "The Advanced Trench HiGT with Separate Floating p-Layer for Easy Controllability and Robustness", PCIM Europe, pp. 313-319, 2011.

(Continued)

*Primary Examiner* — Tong-Ho Kim
(74) *Attorney, Agent, or Firm* — Kevin B. Jackson

(57) ABSTRACT

Systems and methods herein are directed towards semiconductor devices and methods of manufacture thereof, including the formation of a plurality of passive trenches that act as a single passive trench and may be connected to gate electrodes and/or emitters in various embodiments.

20 Claims, 13 Drawing Sheets

(56) References Cited

U.S. PATENT DOCUMENTS

2008/0224207 A1\* 9/2008 Sakamoto ........... H01L 29/0696
257/331
2014/0027845 A1\* 1/2014 Kobayashi .......... H01L 29/7827
257/331
2017/0221881 A1\* 8/2017 Hosoya ............... H01L 29/7397

OTHER PUBLICATIONS

John Shen, "The Past, Present, and Future of IGBT Technology," Illinois Institute of Technology, pp. 1-27, Apr. 7, 2014.

\* cited by examiner

ACCUMULATION ENHANCED INSULATED GATE BIPOLAR TRANSISTOR (AEGT) AND METHODS OF USE THEREOF

CROSS-REFERENCE TO RELATED APPLICATIONS

N/A

BACKGROUND

Insulated gate bipolar transistors (IGBTs) are used in inverter systems such as solar inverters, Power Factor Correctors (PFC), welders, and inductive cooking. Various IGBT architectures can be designed to meet individual application requirements. However, there are trade-offs among device characteristics, such as the on emitter collector voltage, the turn-off energy, the gate charge, and reliability.

SUMMARY

In an embodiment, a method of fabricating a semiconductor device structure comprising: forming an active trench; forming a plurality of passive trenches adjacent to the active trench, and wherein each passive trench of the plurality of passive trenches is separated from an adjacent passive trench by a predetermined distance; forming a first oxide in each passive trench of the plurality of passive trenches; filling the plurality of passive trenches and the active trench with a first filling layer; forming a p-well; removing at least a portion of the filling in the plurality of passive trenches; and subsequent to removing at least the portion of the filling, disposing a second oxide such that the second oxide is disposed in the plurality of passive trenches and on top of the active trench to form a structure configured to act as a single passive trench.

In an embodiment, a semiconductor structure comprising: a first side opposite and parallel to a second side; an anode implant disposed on the second side and in contact with a buffer region; an n-type region extending from the buffer region towards the first side; an active trench comprising a fill material and a gate oxide layer surrounding a portion of the fill material; a super trench comprising a plurality of individual passive trenches and formed adjacent to the active trench, separated from the active trench by a mesa comprising a JFET region and a p-well; a dielectric layer formed on the first side of the device over the passive trench and active trench; an oxide layer from 1000 Å to 6000 Å thick, wherein the JFET region is in contact with the n-type region and the p-well is in contact with the dielectric layer; an n-type source implant formed in the p-well of the mesa to be offset from a centerline of the mesa.

In an alternate embodiment, a semiconductor structure comprising: a first side opposite and parallel to a second side; an anode implant disposed on the second side and in contact with a buffer region; an n-type region extending from the buffer region towards the first side; an active trench comprising a fill material, and a gate oxide layer surrounding a portion of the fill material; a plurality of passive trenches formed adjacent to the active trench and configured to act as a single passive trench such that an accumulation region is formed adjacent to the plurality of passive trenches during activation of the structure, wherein each passive trench of the plurality of passive trenches comprises a bottom oxide in contact with a first electrode region, wherein the first electrode region is separated from a second electrode region of the passive trench by an inter-space oxide; wherein a first passive trench of the plurality of passive trenches is separated from the active trench by a first mesa and the first passive trench is separated from an adjacent passive trench of the plurality of passive trenches by a second mesa, wherein the first mesa and the second mesa each comprise a JFET region and a p-well, a first n-type implant formed in the p-well region of the first mesa; a first p-type implant formed in the p-well of the first mesa and electrically connected to a first emitter; a dielectric layer formed on the first side of the device over the plurality of passive trenches and the active trench, wherein the JFET region is in contact with the n-type region and the p-well is in contact with the dielectric layer.

BRIEF DESCRIPTION OF THE DRAWINGS

There are disclosed in the drawings and in the following description specific systems for the synchronization of a plurality of switching events in electrical circuits. In the drawings.

Figure 1A:
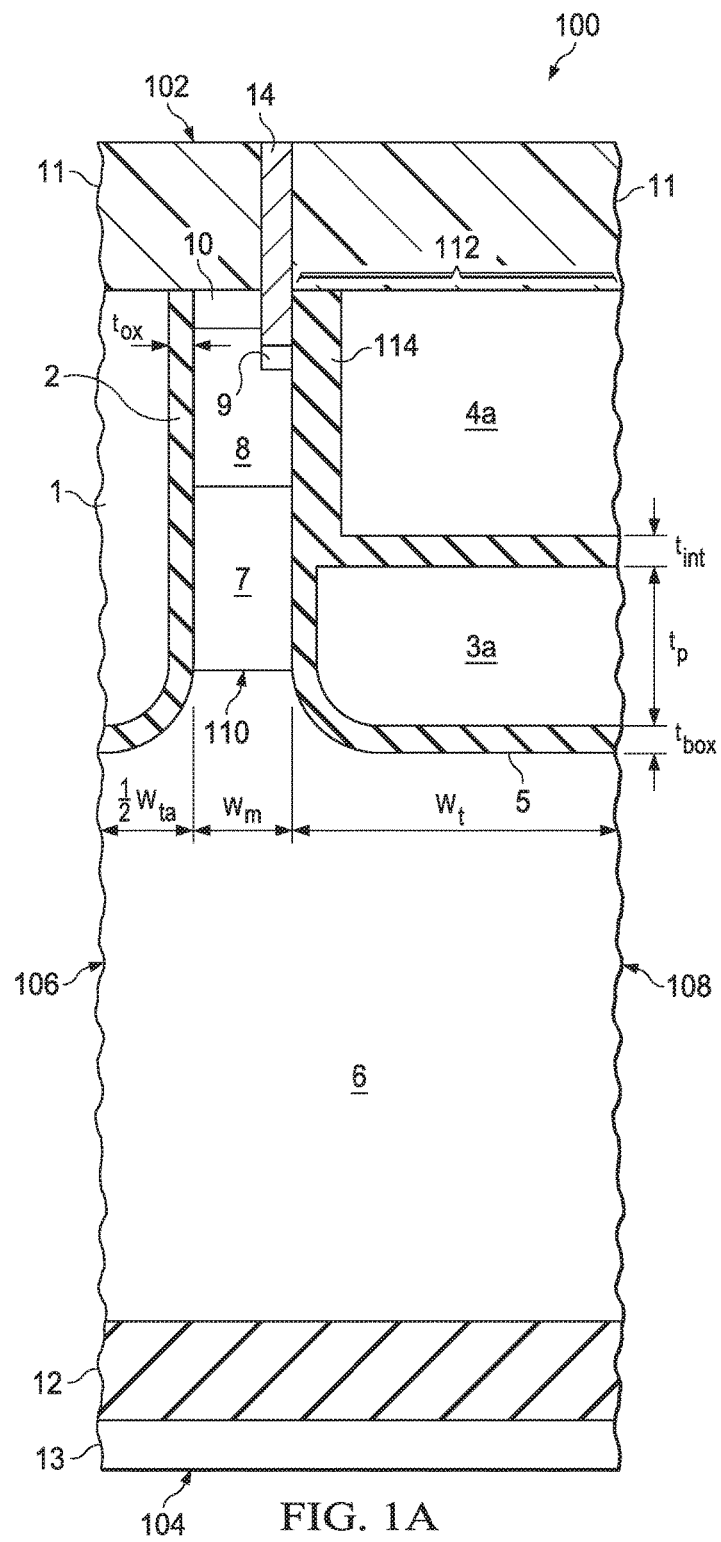
FIG. 1A is a partial cross-section of an AEGT 100 fabricated according to certain embodiments of the present disclosure.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

The working principle of and holes from the backside collector in order to Insulated Gate Bipolar Transistors (IGBT) involves the recombination of the electrons injected from the inversion channel. These electrons have conductivity modulation for lower conduction loss than its unipolar counterpart, the metal-oxide semiconductor field-effect transistor (MOSFET).

The front side injection can be increased by using higher channel density per unit cell but this may result in poor short circuit capability and large gate capacitances due to high channel density per unit cell. However, for faster switching, the front side injection can be suppressed by connecting the trench poly to an emitter instead of to a gate with the cost of additional spreading resistance due to the fact that the electron current has to flow laterally and then downward to recombine with the holes.

The Accumulation Enhanced Insulated Gate Bipolar Transistor (AEGT) manufactured according to certain embodiments comprises (a) a recessed polysilicon region that does not overlap the p-well (p-type well) and (b) a low channel density and narrow mesa (distance between the active trench and a first passive trench) per unit cell. Front side injection is enhanced by suppressing the hole current entering the p-well instead of increasing the channel density so that the gate capacitance and the saturation current level stay low. The AEGT also has low channel density and a narrow mesa/p-well per unit cell for low emitter-collector on-voltage ($V_{ce}$,on), low gate capacitance, and low saturation current. However, the floating p-region is replaced with a buried recess poly in the thick oxide layer. The buried poly gate creates an additional accumulation layer to significantly reduce the spreading resistance. In addition, the recess poly gate cluster improves the UIS capability by discharging the current through the capacitance.

When the polysilicon regions are connected to the gate, an accumulation layer, which may also be referred to as a zone or a region, is formed underneath the active trench to assist the spreading of the electrons. The term "formation" and derivatives thereof discussed herein may comprise layer deposition, alteration including patterning, and full or partial removal that may be referred to as an "etch-back." The polysilicon is recessed so that no inversion layer is formed near the recessed poly, which not only reduces the channel density per unit cell but also the gate capacitance ($C_{gs}$) associated with the polysilicon regions. The AEGT is configured to deliver: (1) low $V_{ce}$, on products with enhanced short circuit capability, (2) low switching loss products with an improved $V_{ce}$,on-turn-off energy tradeoff curve, and (3) low gate capacitance products by recessing the poly.

The AEGT structure described herein may be fabricated such that a junction field effect transistor (JFET) is formed next to an active trench that is separated by a predetermined distance from a plurality of accumulation or passive trenches. This predetermined distance may be referred to as a "mesa." Each passive trench of the plurality of passive trenches may be separated from an adjacent passive trench by a predetermined distance that may comprise a thickness that is less than a thickness of the mesa. The combination of each passive trench of the plurality of passive trenches forms a super trench, e.g., fabricating the plurality of passive trenches as discussed herein provides a method of forming a single composite wide trench of varying widths. As used herein, the term "super trench" shall mean more than two passive trenches formed with a mesa in between that may comprise polysilicon, metal, dielectric, or oxide deposits, and acts as a single passive trench during the operation of the device. The super trench is formed in part by the deposition of a thick (1000 Å-6000 Å) oxide on top of a structure comprising the active trench, the passive trenches, and at least one n-type and p-type implant formed in a p-well of the structure prior to deposition of the thick oxide, which may be referred to as an "inter-space" oxide, since it may be located between and act to electrically isolate two areas of a passive trench. In an embodiment, etching back the polysilicon in the passive trenches and subsequently forming the polysilicon recess in the plurality of passive trenches enables the super trench to be formed by subsequent oxidation, but still maintains the ability to electrically bias the polysilicon in the trench bottom (i.e., the biasing will create a charge accumulation under the super trench). There are dopants and dopant levels (concentrations) discussed herein for both n-type and p-type materials that may be referred to as "regions," "components," "portions," or by specific functionalities. The dopants employed for p-type components may comprise elements with 3 valence electrons such as boron (B) and gallium (Ga), and the dopants employed for n-type components may comprise elements with 5 valence electrons such as arsenic (As) or phosphorous (P).

The device is discussed herein with respect to the active trench and the features on one side of the active trench that are mirrored on the other side of the active trench. Thus, there would be a first plurality of passive trenches formed on a first side of the active trench, and the first of this plurality is separated from the active trench by a first mesa. Additionally, a second plurality of passive trenches are formed on a second side of the active trench and separated from the active trench by a second mesa. In an embodiment, each trench of the first and second pluralities of trenches comprises similar dimensions.

In an embodiment, a sacrificial oxide may be formed on the active trench, the plurality of passive trenches, and other features including a p-ring termination and an n+ termination ring. The p-ring termination is used in an IGBT to control the high voltage fields from breaking down at the die edge, and the n+ termination ring is configured to maintain an even external field surrounding the p-ring. The sacrificial oxide may be removed at least in part, and, subsequently, a gate oxide is formed to coat each of the passive trenches of the plurality of passive trenches and the active trench. In an embodiment, this gate oxide may be from 500 Å to 2000 Å thick, and in another embodiment, this gate oxide may be from 300 Å to 3000 Å thick and forms what is referred to as the "active electrical channel" at the interface of the gate oxide and the junction field-effect transistor (JFET) structure.

Subsequently, the plurality of passive trenches and the active trench are filled, for example, with oxide, metal, polysilicon, or dielectric material. The filling process may also be described as the formation of trench interiors, "fillings," or "filling layers," and this may occur in a plurality of formation steps. The formation process may be configured to reduce overall film stress, as excessive film stress may bow the wafer.

In an embodiment, a first filling layer for the trenches may be formed over the entire surface of the device and etched back such that the first filling layer takes up the entire volume of each of the passive and active trenches but is not disposed on a top region of the device itself. In an embodiment, subsequent to the formation of the first filling layer, an n-type implant may be formed that may be configured to be electrically coupled to a source. This implant may be referred to as an "NSRC implant," and may be formed in a p-well such that the NSRC implant is disposed below the gate oxide at the top of the p-well. The NSRC implant may be disposed between the active trench and a passive trench, and may be subsequently activated using heat so that the implant reacts with the silicon matrix to make it an electrically active component of the semiconductor device. In some embodiments, another oxide etch-back may be performed. In one example, this etch-back may reduce an oxide layer by up to 50%, e.g., etching a layer of about 900 Å to comprise a thickness of about 500 Å. In one example, this second etchback of the oxide is employed to move the implant steps to after the thermal oxidation, and is different than the gate oxide. The gate oxide was previously deposited and then protected with the gate polysilicon in the active trenches. The oxide disposed in the second oxide step is the thermal oxide that is used to merge the plurality of passive trenches into a single super trench.

A p-well may be formed, before or after the NSRC implant and second oxide etch-back, below where the NSRC implant is or will be disposed and in between the active trench and a passive trench such that it has a width that is substantially equal to that of the mesa. In some embodiments, a photoresist may be formed and removed subsequent to the activation of the NSRC implant. The formation of the NSRC implant and p-well(s) is done prior to the deposition of a thick oxide layer so that the thick oxide layer does not have to be removed before the formation of these elements. This saves both time and cost in the process, and improves quality because there is no risk that the thick oxide layer, deposited subsequently as discussed below, could be damaged during formation of the other components. In an embodiment, a poly mask may be used to define which trenches have the poly recessed (etched back) and which do not. That is, the poly mask may be used to define which trenches will be the active trenches and which trenches will become part of the super trench structure.

In an embodiment, the first filling layer of the passive trenches is removed in whole or in part. In some embodiments, 5%-10% of the first filling layer remains in each passive trench, and in alternate embodiments, 10%-25% of the first filling layer remains in each passive trench. This first filling layer may measure from 0 microns to 5 microns, regardless of the type of fill material used.

In still other embodiments, the first filling layer in the passive trenches is completely removed, leaving the gate oxide layer in the passive trenches. In an example where the first filling layer of the passive trenches is not completely removed, the remaining material enables connection of the active regions to the emitter or to the gate. If the gate connection is made, accumulation occurs in the passive trench. If poly is used for the first filling layer, then the first filling layer is conductive and can be biased and may be used on the active gate or on the emitter. This may be desirable to eliminate transient negative capacitance problems. The "dv/dt" is the rate of change of the voltage, that is, a measure of the ability to retain a blocking state under the influence of a voltage transient. If connected to the emitter, the dv/dt may be slowed down and the mechanism may be referred to as a "snubber." In some embodiments, a photoresist may be formed, including patterning, after the etching back of the first filling layer, and may be removed subsequent to further processing. It is noted that the first filling layer deposited in the active trench remains in the active trench and is not etched back nor removed. This etch-back of the first filling layer may be employed if the filling layer is composed of poly because the poly is conductive and therefore it may not be desirable to leave it on all areas of the device where it is initially disposed. Thus, the surface layer of the first filling layer must be removed, but it remains in the seam/gap of the super trench.

In an embodiment, subsequent to the partial or total removal of the filler layers in the passive trenches, a thermal oxidation step is performed. This oxidation forms a thick oxide (1500 Å-1.5 µm), across the device, as compared to other oxides including the gate oxides discussed herein. This thick oxide is formed in areas including the passive trenches. This oxide may be referred to as an "inter-space" oxide since it occupies a space between two portions of the device as to prevent contact between the two portions. This oxidation step forms what may be referred to as a "super trench" that encompasses two or more passive trenches such that the super trench becomes a region that acts as a single trench structure. When a poly region is connected to a gate electrode, an accumulation layer is formed in the silicon structure (drift region) underneath the super trench to promote current spreading. The gate may be biased to 15-20V. In an example where the poly region is grounded, there is zero potential and no accumulation layer is formed. The filling of the super trench may be accomplished by this thermal oxidation step which merges the closely-spaced trenches by oxidizing the silicon pillars that once separated them.

The inter-space oxide formation reduces the volume of the passive trenches. Thus, a second filling step of the passive trenches may be performed to form a second filling layer with either polysilicon, oxide, dielectrics, or metals. The amount deposited in this filling step may comprise less filling material than used during the initial filling of the passive trenches. In an embodiment, a volume of the passive trenches not containing the inter-space oxide may be filled with the materials discussed herein, and the second filling may be disposed on top of the inter-space oxide. The formation of the second filling layer may be performed such that the second filling layer comprises a thickness from about 0 Å (when it is not used) to about 5µ, and the filled trenches may be subsequently annealed, for example, from 15-45 minutes at about 1000° C.

The second filling may be employed to finish filling the voids/seams in the passive trenches that were not filled by thermal oxide. In some examples, polysilicon may be used if an electrically biased super trench is desired. This can be an advantage for eliminating negative capacitance in the transient condition. In an embodiment, the second filling layer is not masked during one or more subsequent patterning/fabrication operations. This may be the case, for example, when either the last remaining passive trench opening is filled with a polysilicon deposition that is followed by an etch-back of the polysilicon, or when the last remaining passive trench opening is filled with oxide, and no etch-back is required. In at least some embodiments, if the first filling layer consists of poly, there is a blanked etch-back performed so as to leave the poly only in the "seams" of the "super trenches." However, if the first filling is oxide, then no etchback is performed.

In an embodiment, the originally deposited filling layer in the passive trenches may be removed in part. An oxide layer may then be formed in the passive trenches, including on top of the remaining filling layer. Subsequently, a second filling layer may be disposed that may comprise the same material or a different material than the previously deposited filling layer. The second filling layer may be separated from the first via the inter-space oxide layer.

Subsequent to re-filling the passive trenches, a phosphosilica glass (PSG) may be disposed on the structure to a thickness from about 3000 Å to about 6000 Å, and a tetraethyl orthosilicate (TEOS) layer may be disposed by CVD to a thickness from 5000 Å to about 9000 Å. The deposition of the PSG and the TEOS layers, followed in some cases by a densification step for about 30 minutes at about 950° C., form the pre-metal dielectric layer across the top of the device. In some embodiments, a via or vias may be formed in the pre-metal dielectric layer in one or more locations. As discussed herein, a via may be formed through one or more layers in order to provide, for example, contact between various layers in order to electrically couple device components. In some embodiments, the formation of the PMD layer results in a surface of less than ideal smoothness. In this example, an oxide chemical/mechanical polish (CMP) step may be performed in order to smooth and flatten the surface to allow further processing.

In some embodiments, the further processing of the structure may include using a photoresist and performing a contact oxide etch subsequent to exposing the photoresist to a deep UV treatment of about 0.20 microns. The photoresist may then be removed and another etching step may be performed prior to a wet clean. In an embodiment, the NSRC implant is formed in the p-wells on either side of the active trench and may span the width of those areas. In alternate embodiments, the NSRC implant may be less than the width of the inter-passive-trench mesas and may be formed off-center, closer to or in contact with the active trench than the passive trench on the other side of the p-well. This enables the emitter contact to be disposed further away from the active region.

Subsequent processing of the device may comprise disposing p-type contact enhancing (P-ENH) implant that may be employed to ensure contact with the p-well, and then the device may be subject to a short anneal. In some embodiments, an amorphization implant may be used in combination with the P-ENH implant and is introduced immediately before and in an overlapping location with the P-ENH implant. The amorphization implant may be employed to prevent boron in the P-ENH implant from diffusing away from the implant region. The P-ENH implant is formed after a contact opening is formed through the dielectric layer and the inter-space oxide, and it may be formed at the bottom of the contact such that the contact opening serves as the self-aligned mask for the P-ENH implant. The P-ENH implant serves to provide good (functional) contact to the p-well and to cut-off a parasitic electrical path to the NSRC region.

FIG. 1A is a partial cross-section of an AEGT 100 fabricated according to certain embodiments of the present disclosure. In FIG. 1A, the AEGT 100 comprises a first end 102 and a second end 104. In one example, the first end 102 may be referred to as the "top" and the second end 104 may be referred to as the "bottom." An anode implant 13 may be disposed at the bottom 104, and may connect to the collector (not shown). In an embodiment, and as measured from 102 to 104, the anode implant 13 may comprise a p-type dopant concentration from about $1\times10^{13}$ cm$^{-2}$ to $1.0\times10^{15}$ cm$^{-2}$ or from about $5\times10^{12}$ cm$^{-2}$ to $1.0\times10^{15}$ cm$^{-2}$. A buffer layer 12 may be formed in contact with the anode implant 13 and may comprise a dopant concentration from about $1.0\times10^{12}$ to $1.0\times10^{14}$ cm$^{-2}$. A drift region 6 comprising n-type materials may be disposed on top of the buffer layer 12 and may extend from a first side 106 of the AEGT 100 to a second side 108. The figures herein are partial schematic cross-sections and the "sides" of the device discussed herein are used for reference and illustrative purposes.

The drift region 6 is also adjacent to a gate oxide layer 2 formed in an active trench 1 on a first side 106 of the AEGT 100. The gate oxide layer 2 is also formed around a passive trench 112. This passive trench 112 is formed on a first side of the active trench 1, and is formed, according to methods discussed herein, from a plurality of passive trenches that were previously formed as to be separated from each adjacent passive trench by less than 5 microns. Thus, the passive trench 112 is a super trench, a single composite trench which can range in width depending upon the number and configuration of passive trenches encompassed in the super trench. FIG. 1A is an illustrative embodiment where the separation between passive trenches is 0 microns, in contrast to FIGS. 2A and 3A below, which comprise inter-passive-trench mesas. The passive trench 112 illustrated in FIG. 1A comprises an inter-space oxide layer 114 that may be from 1000 Å to 20,000 Å thick ($t_{int}$) and may be in contact with the region 4a which may comprise polysilicon separated from the region 3a by the inter-space oxide layer 114. In some embodiments, $t_{int}$ may be from about 3000 Å to 15,000 Å. The inter-space oxide layer may be disposed to at least mechanically and in some embodiments electrically isolate the region 4a from the region 3a. The formation of the inter-space oxide layer 114 is discussed in detail herein, and its formation and location when there are still individual passive trenches is illustrated and discussed in FIGS. 2 and 3 below.

In an embodiment, the first poly electrode 3a, which may be referred to as a "buried" poly electrode since it is underneath the inter-space oxide 114, and the region 4a each comprise one of an oxide, polysilicon, metal, or a dielectric material. The region 4a is formed vertically above 3a and separated from 3a by the inter-space oxide layer 114. The thickness of 3a ($t_p$) measured vertically may be from 0.3 microns to about 3 microns. The trench 112 width $W_t$ measured horizontally may be from about 0.6 microns to about 3 microns, the thickness of a portion of an oxide 5 at the bottom of the second portion 3a comprises a thickness ($t_{box}$) measured vertically from 300 Å to 3000 Å.

A partial view of the active trench 1 is shown in FIG. 1A which includes an active trench width $W_{ta}$, which may range from 0.6 microns to about 3 microns, measured horizontally. Half of the width $W_{ta}$ is shown in FIG. 1A for illustrative purposes. A mesa 110 is formed in between the active trench 1 and the passive trench 112. The mesa 110 comprises a JFET region 7 that may comprise phosphorous and which is formed in contact with the drift region 6. In an embodiment, the mesa 110 may comprise a width $W_m$ from about 0.2 microns to about 15 microns. The JFET region 7 may comprise a dopant concentration from about $5.0\times10^{11}$ to $4.0\times10^{13}$ cm$^{-2}$ and may also be in contact with a p-well region 8 comprising a boron dopant at a concentration from about $1.0\times10^{13}$ to $1.0\times10^{15}$ cm$^{-2}$. As the JFET region 7 and p-well region 8 are formed in the mesa 110, each may comprise a same or substantially similar width as the mesa width $W_m$.

In an embodiment, the p-well 8 is separated from the active trench 1 and the passive trench 112 by the mesa 110. The p-well 8 comprises a recessed p-type implant 9 that may comprise boron or $BF_2$ and is in contact with the emitter contact 14 to connect to an emitter (not shown). This implant 9 may be formed by forming a via in the p-well 8. As shown in FIG. 1A, the implant 9 may be implanted such that it is surrounded by the p-well 8 and is not centered in the mesa 110. On a side of the mesa 110 opposite to the implant 9, an n-type (source) implant 10 comprising arsenic or phosphorous may be disposed or formed, for example, by forming a via in the p-well 8. In an embodiment a dopant concentration of the implant 9 may be from about $1.0\times10^{14}$ to $1.0\times10^{16}$ cm$^{-2}$ and the dopant concentration of the NSD implant 10 is from about $1.0\times10^{14}$ to $1.0\times10^{16}$ cm$^{-2}$. In an embodiment, a dielectric layer 11 is formed over the active trench 1, the mesa 110, and the passive trench 112.

Figure 1B:
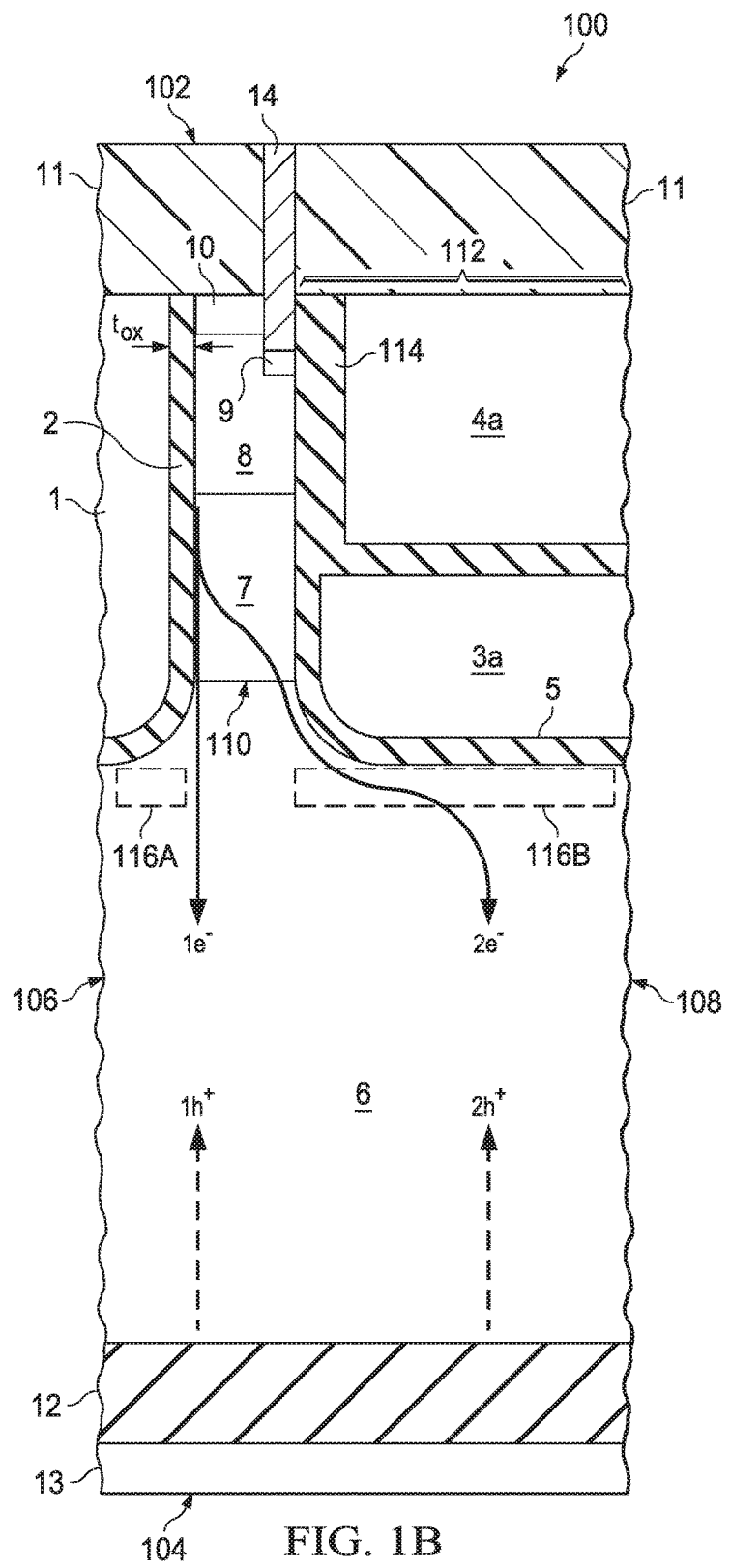
FIGS. 1B and 1C are partial cross-sections of the AEGT 100 in FIG. 1A that illustrate electron and hole currents in various configurations of the AEGT 100 according to certain embodiments of the present disclosure.
Figure 1C:
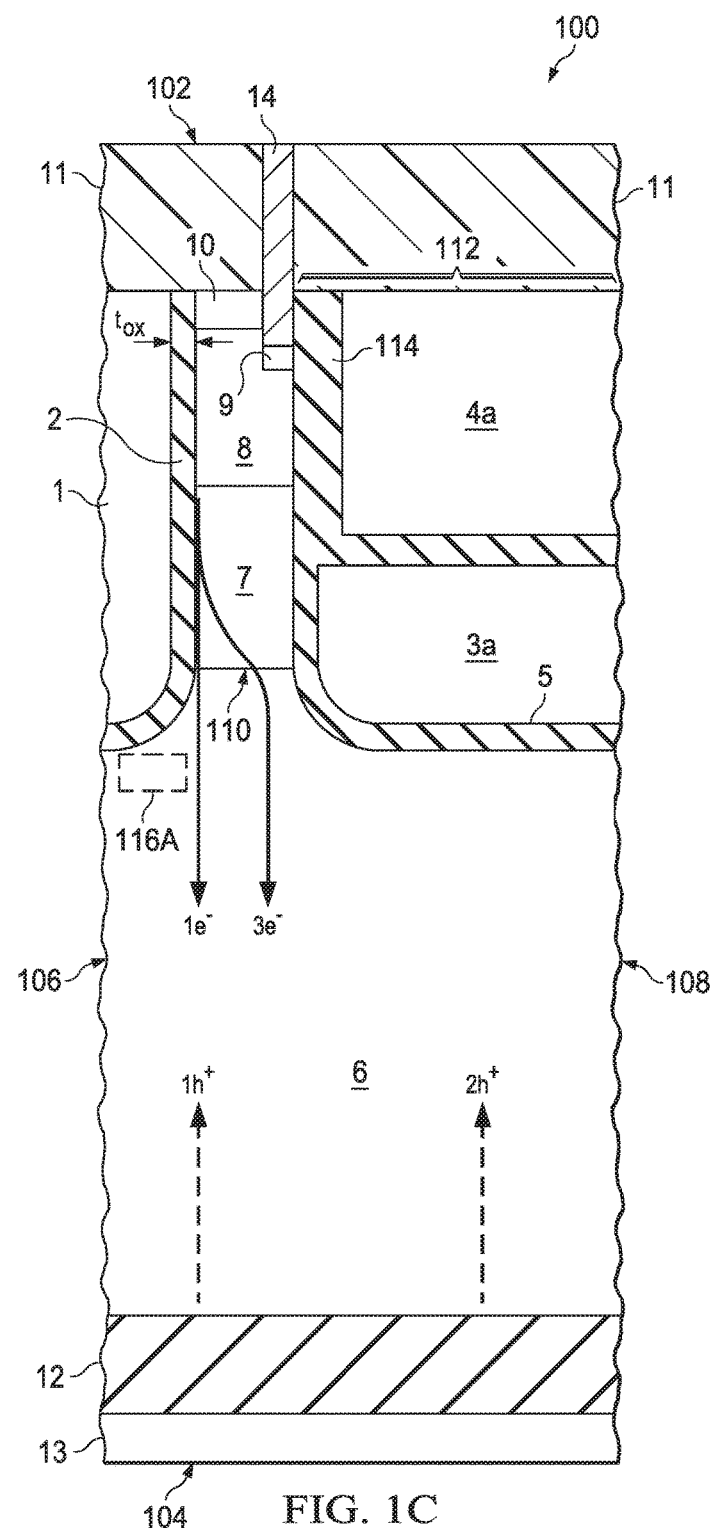

FIGS. 1B and 1C are partial cross-sections of the AEGT 100 in FIG. 1A that illustrate electron and hole currents in various configurations of the AEGT 100. Some features illustrated in FIG. 1A are not shown in FIGS. 1B and 1C for ease of illustration of the electron currents, hole currents, and accumulation zones. FIG. 1B shows the electron currents, hole currents, and accumulation zones which are generated when 3a is connected to a gate electrode (not shown), in contrast to FIG. 1C which illustrates those which result when 3a is connected to an emitter electrode (not shown). In particular, FIG. 1B illustrates a first electron path $1e^-$, the active electron channel, a second electron path $2e^-$, and two hole currents $1h^+$ and $2h^+$ that flow from the anode implant 13 into the drift region 6. In addition, FIG. 1B illustrates two accumulation zones 116A and 116B. The first accumulation zone 116A is located underneath the active trench 1, and the second accumulation zone 116B is formed under the region 3a when 3a is connected to the gate electrode. FIG. 1C illustrates two hole currents $1h^+$ and $2h^+$ that flow from the anode implant 13 into the drift region 6, the active electron channel $1e^-$, a single accumulation zone 116A, as well as a second electron current $3e^-$. in contrast to the electron current $2e^-$, the second electron current $3e^-$ does not extend into the area beneath 3a, and thus there is no second accumulation zone in FIG. 1C.

Figure 2A:
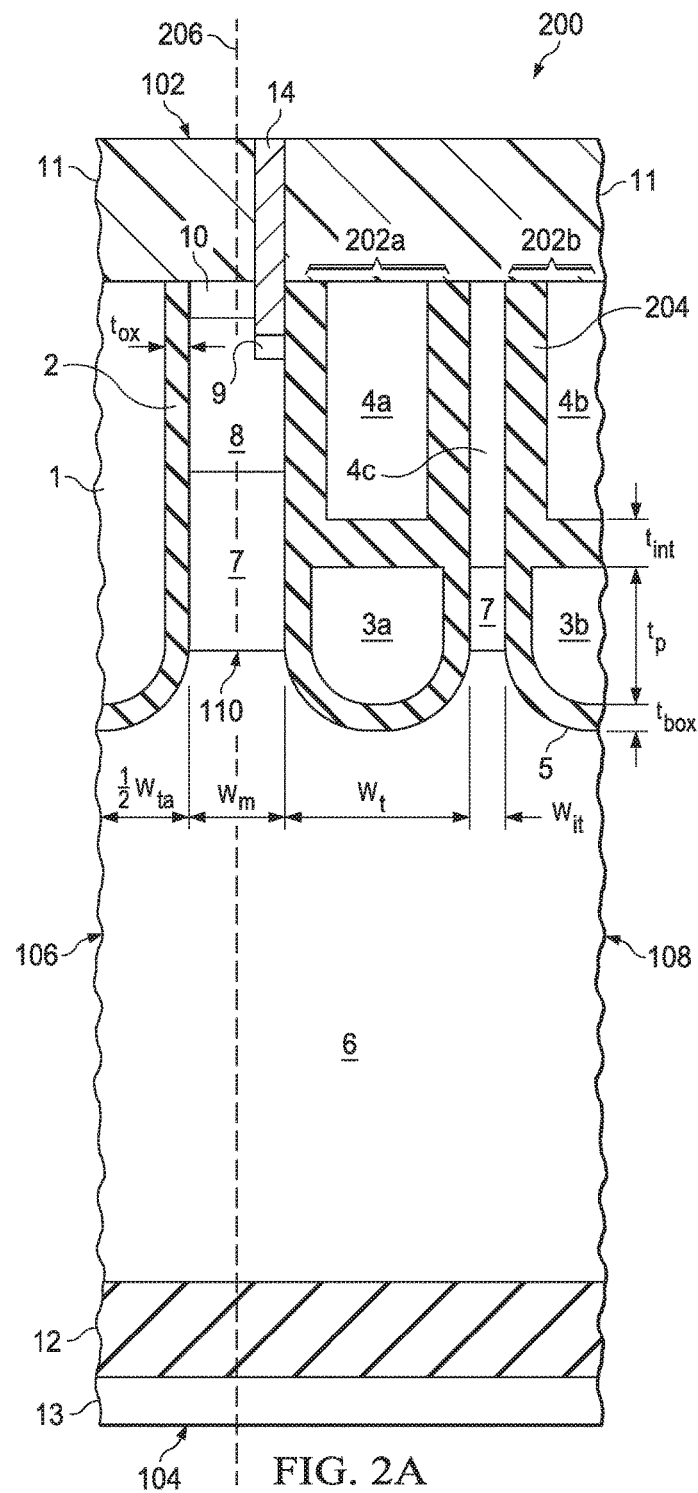
FIG. 2A is a partial cross-section of an AEGT 200 fabricated according to certain embodiments of the present disclosure.

FIG. 2A is a partial cross-section of an AEGT 200 fabricated according to certain embodiments of the present disclosure. In FIG. 2, the AEGT 200 comprises a first end 102 and a second end 104. In one example, the first end 102 may be referred to as the "top" and the second end 104 may be referred to as the "bottom," as may various layers and components disposed between the two ends 102, 104. An anode implant 13 may be disposed at the bottom 104, and may connect to the collector (not shown). In an embodiment, and as measured from 102 to 104, the anode implant 13 may comprise a dopant concentration from about $1 \times 10^{13}$ cm$^{-2}$ to $1 \times 10^{15}$ cm$^{-2}$. A buffer layer 12 may be formed in contact with the anode implant 13 and may comprise a dopant concentration from about $1.0 \times 10^{12}$ to $1.0 \times 10^{14}$ cm$^{-2}$. A drift region 6 comprising an n-type material may be formed on top of the buffer layer 12 and may extend from a first side 106 to a second side 108 of the device. An active trench 1 is formed on a first side 106. Half of the active trench 1 is illustrated in FIG. 2A for ease of illustration. The active trench 1 is separated from a plurality of passive trenches 202 by a mesa 110 that comprises a width W$_m$ from about 0.2 microns to about 15 microns. A passive trench 202a of the plurality of passive trenches 202 is illustrated, as is half 202b of a passive trench 202 in order to illustrate the region 4c. The region 4c may comprise an oxide, and may be referred to as an inter-trench region comprising an inter-trench spacing width W$_{it}$ that may be from 0 microns to 5 microns. The region 4b may be fully oxidized in some embodiments in order to eliminate the floating p-region. The inter-trench spacing comprises a region 4b that may comprise a polysilicon or a thermally-grown oxide. The active trench 1 comprises a polysilicon, oxide, metal, or dielectric core and a gate oxide 2. The active trench may be from about 0.6 microns to about 3 microns in width as measured horizontally. The half-trench 202b comprises regions 4b and 3b that are similar to regions 4a and 3a in the trench 202a.

In an embodiment, each passive trench 202 comprises an inter-space oxide 204 comprising a thickness (t$_{int}$) from 1000 Å to 20,000 Å disposed around a first portion 4a of the trench 202a and a bottom oxide 5, which is formed as part of the gate oxide 2, disposed around at least a portion of a second portion 3a, which may be referred to as a polysilicon electrode. The bottom oxide 5 is a part of the gate oxide 2, and is referred to as a "bottom" oxide 5 due to the portion of the gate oxide 2 that is disposed at the bottom of the passive trench 202a, as opposed to that which is formed on the sides of the passive trenches 202a and in other areas. The thickness of the bottom oxide 5 at the bottom of the second portion 3a comprises a thickness (t$_{bO}$) that may be from about 300 Å to 3000 Å. In an embodiment, a thickness t$_{ox}$ of the gate oxide is from 300 Å to 3000 Å. In various embodiments, the first 4a and the second 3a portions of the trench 202a comprise metal, polysilicon, dielectric material, or an oxide. The thickness of the second portions 3a and 3b (t$_p$) may be from 0.3 microns to about 3 microns. In an embodiment, the polysilicon of 3a and 3b may prevent stress cracking after processing steps including oxidation.

The passive trench 202a width W$_t$ may be from about 0.6 microns to about 3 microns. A centerline 206 is illustrated through the mesa 110, the n-type source 10 is disposed off-center from the centerline 206, and the p-type implant 9 is disposed off-center in the opposite direction of the n-type source 10 such that each of the implants 9 and 10 sits on opposite sides of the p-well region 8. In an embodiment, the regions 3a and 3b may be connected to a gate or to an emitter (not shown) to modulate the front side injection efficiency and provide different gate-to-emitter and emitter-to-collector capacitance ratios.

In an embodiment, the p-well 8 is separated from the active trench 1 and the passive trench 202a by the gate oxide 2, and comprises a high voltage p-region (PHV) implant 9 that may comprise boron or BF$_2$ and be in contact with the emitter contact 14 to connect to an emitter (not shown). As shown in FIG. 2A, the implant 9 may be implanted such that it is offset and is not centered in the mesa 110. On a side of the mesa 110 opposite to the implant 9, an n-type (source) implant 10 comprising arsenic or phosphorous may be disposed. In an embodiment, a thickness of the implant 9 may comprise a dopant concentration from about $1.0 \times 10^{14}$ to $1.0 \times 10^{16}$ cm$^{-2}$ and a dopant concentration of the NSD implant 10 may be from about $1.0 \times 10^{14}$ to $1.0 \times 10^{16}$ cm$^{-2}$. In an embodiment, a dielectric layer 11 is disposed over the active trench 1, the mesa 110, and the passive trench 112. There is no NSRC implant formed in 4c since there is no electrical channel formed in that region during use of the AEGT 200.

Figure 2B:
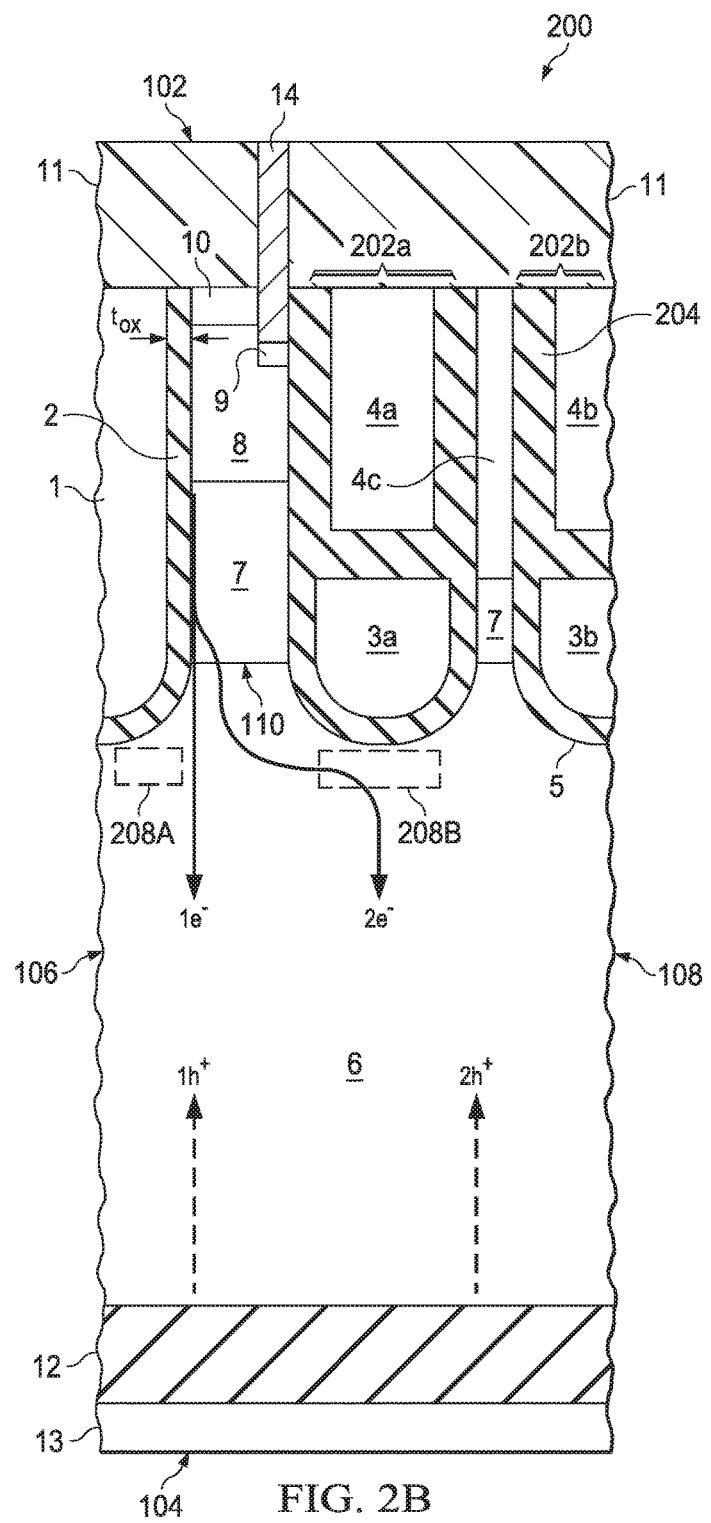
FIGS. 2B-2D are partial cross-sections of the AEGT 200 in FIG. 2A that illustrate electron and hole currents in various configurations of the AEGT 200 according to certain embodiments of the present disclosure.
Figure 2C:
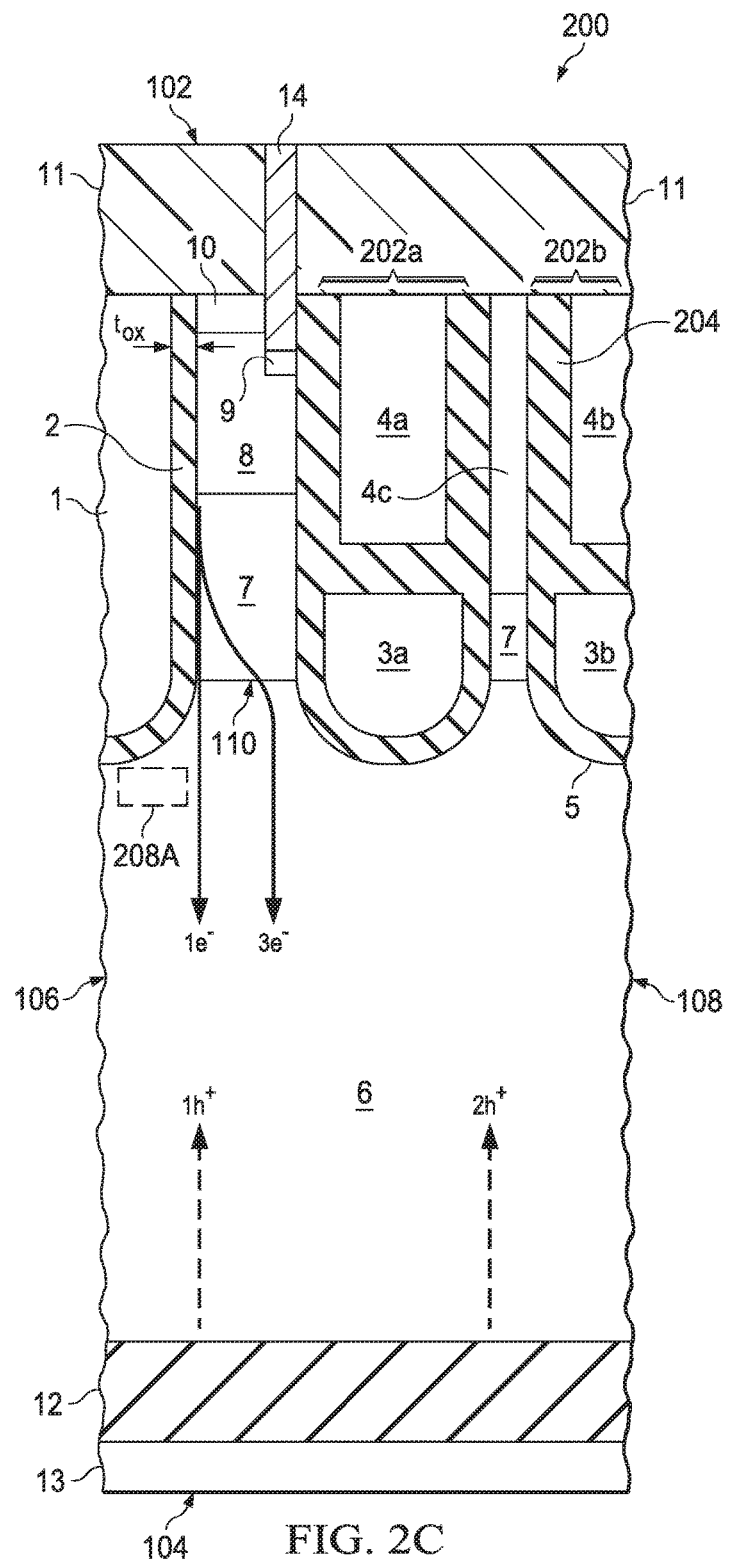
Figure 2D:
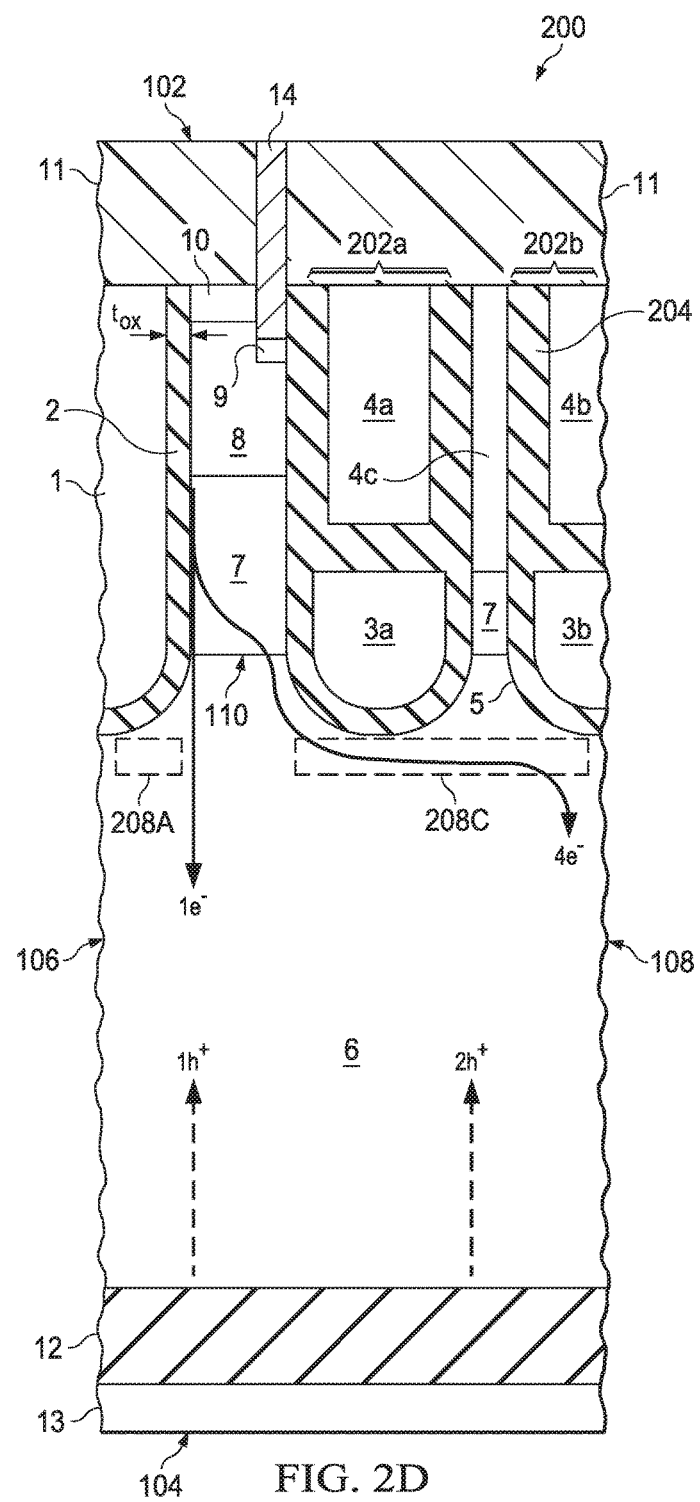

FIGS. 2B-2D are partial cross-sections of the AEGT 200 in FIG. 2A that illustrate electron and hole currents in various configurations of the device 200. Some features illustrated in FIG. 2A are not shown in FIGS. 2B-2D for ease of illustration of the electron currents, hole currents, and accumulation zones. FIG. 2B shows the electron currents, hole currents, and accumulation zones which are generated when 3a is connected to a gate electrode and 3b is connected to an emitter. In particular, FIG. 2B illustrates a first electron path $1e^-$, the active electron channel, a second electron path $2e^-$, and two hole currents $1h^+$ and $2h^+$ that flow from the anode implant 13 into the drift region 6. In addition, FIG. 2B illustrates two accumulation zones 208A and 208B. The first accumulation region 208A is formed under the active trench 1, and the second accumulation region 208B is formed under 3a when 3a is connected to the gate electrode.

FIG. 2C illustrates currents when both 3a and 3b are connected to emitters. FIG. 2C shows two hole currents $1h^+$ and $2h^+$ that flow from the anode implant 13 into the drift region 6, the active electron channel $1e^-$, a single accumulation zone 208A, as well as a second electron current $3e^-$ which, in contrast to the electron current $2e^-$, does not extend into the area beneath 3a. Thus, there is no second accumulation zone in FIG. 2C.

FIG. 2D illustrates currents when both 3a and 3b are connected to gate electrodes. FIG. 2C shows two hole currents $1h^+$ and $2h^+$ that flow from the anode implant 13 into the drift region 6, the active electron channel $1e^-$, a first accumulation zone 208A, and a second electron current $4e^-$ which extends beneath both 3a and 3b, forming a second accumulation zone 208C.

Figure 3A:
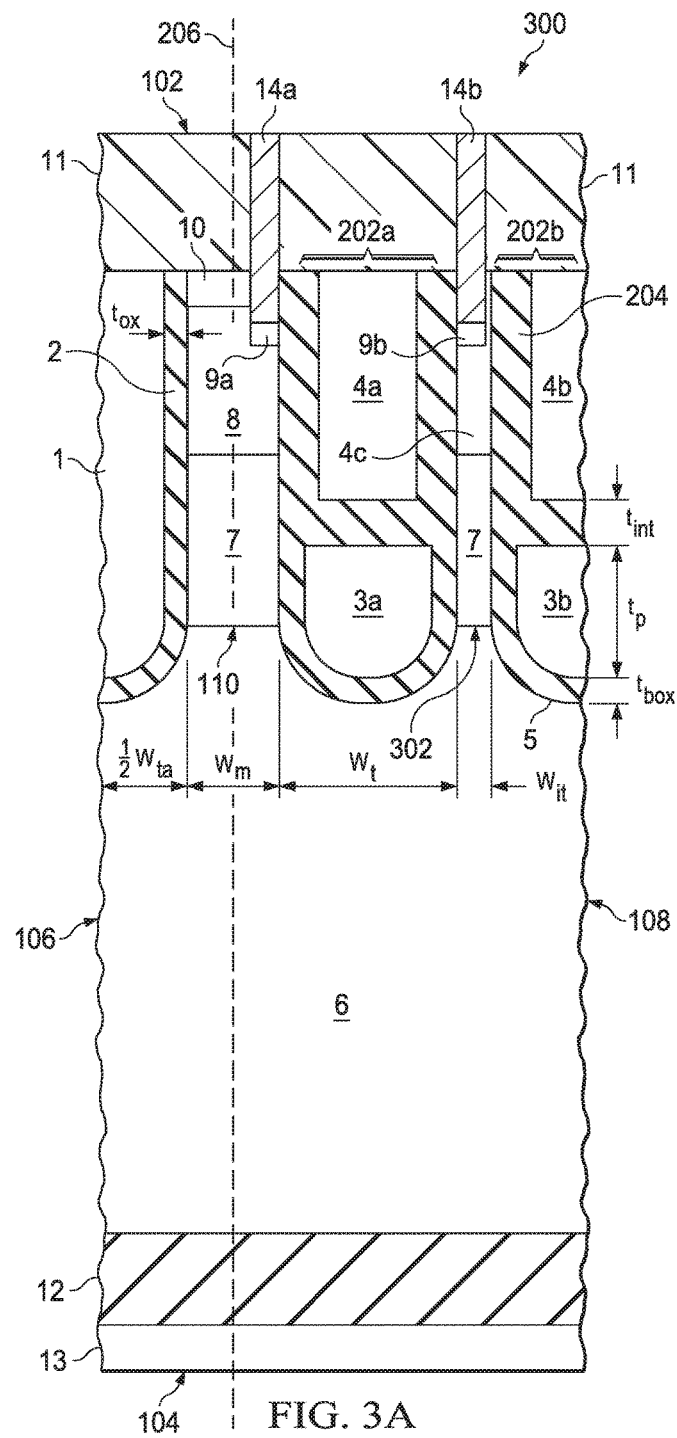
FIG. 3A is an alternate embodiment of an AEGT 300 according to certain embodiments of the present disclosure.

FIG. 3A is an alternate embodiment of a semiconductor device 300. The semiconductor 300 comprises a substantially similar structure to that of FIG. 2A, except that in FIG. 3A, the first passive trench 202a and the second passive trench 202b are separated by a second mesa 302 which may also be referred to as the inter-trench region 302. This region 302 comprises the same components as the mesa 110 which is also present in FIGS. 1A and 2A, such that, instead of the device 200 of FIG. 2A that has region 4c disposed in the inter-trench region 302, the JFET region 7 is formed in between the first 202a and second 202b passive trenches and in between the inter-space oxide layers 204 that are in contact with each of portions 4a and 4b. An inter-trench 302 spacing width $W_{it}$ may be from 0 microns to 5 microns.

The p-well region 8 is formed in contact with the JFET layer 7. A first recessed p-type contact 9a is disposed in the p-well region 8 of the mesa 110 and a second recessed p-type contact 9b is disposed in the p-well region 8 in the second mesa 302. The contact 9a is electrically connected to the first emitter contact 14a and the contact 9b is electrically connected to the second emitter contact 14b. Both emitter contacts 14a and 14b, similar to emitter contact 14 in FIGS. 1A and 2A, extend through a dielectric layer 11 that is disposed on top of and across the active trench 1 and the passive trenches 202a and 202b. As with the emitter contact 14 in FIG. 2, the emitter contact 14a may be formed off-center from a centerline 206 of the mesa 110 such that it is positioned closer to the passive trench than the active trench, or may be formed aligned with the centerline (not pictured).

Figure 3B:
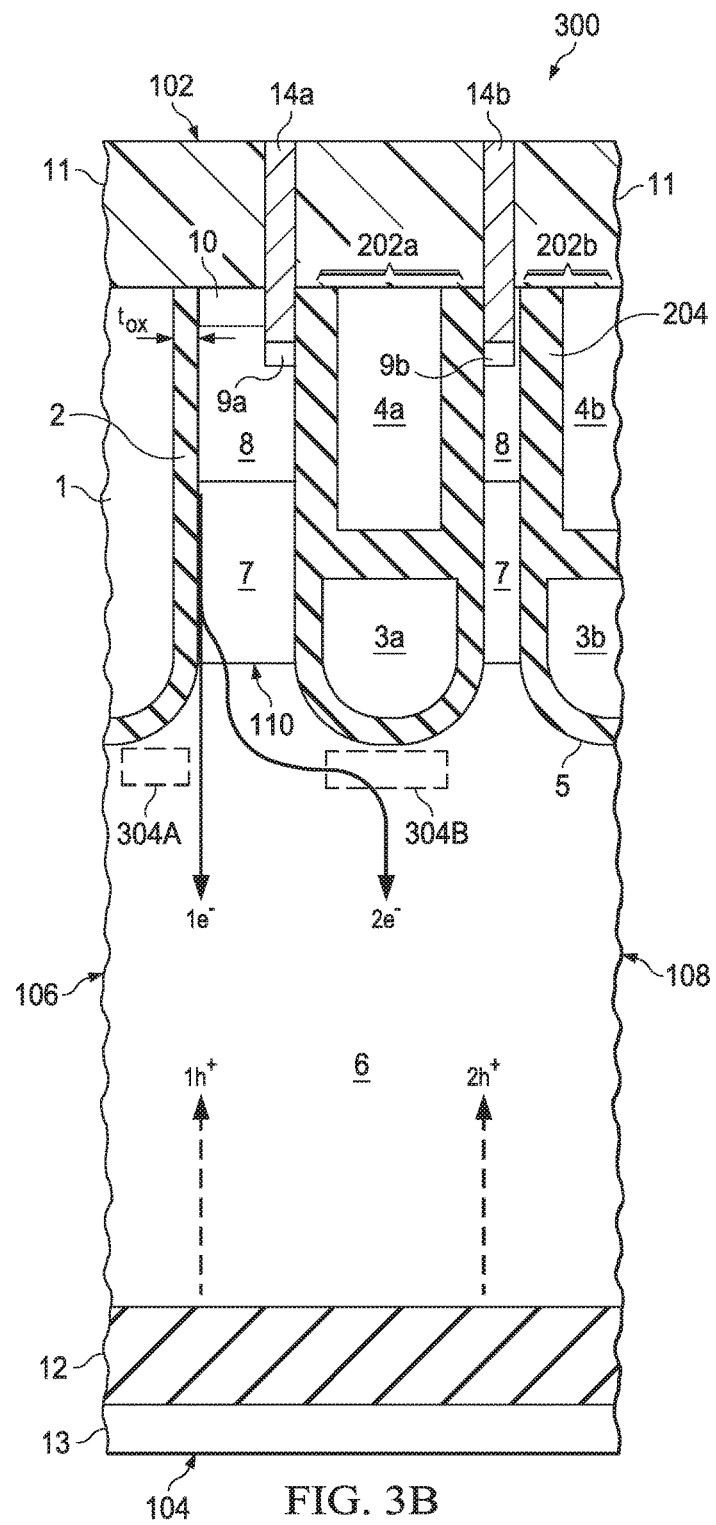
FIGS. 3B-3D are partial cross-sections of the AEGT 300 in FIG. 3A that illustrate electron and hole currents in various configurations of the AEGT 300 according to certain embodiments of the present disclosure.
Figure 3C:
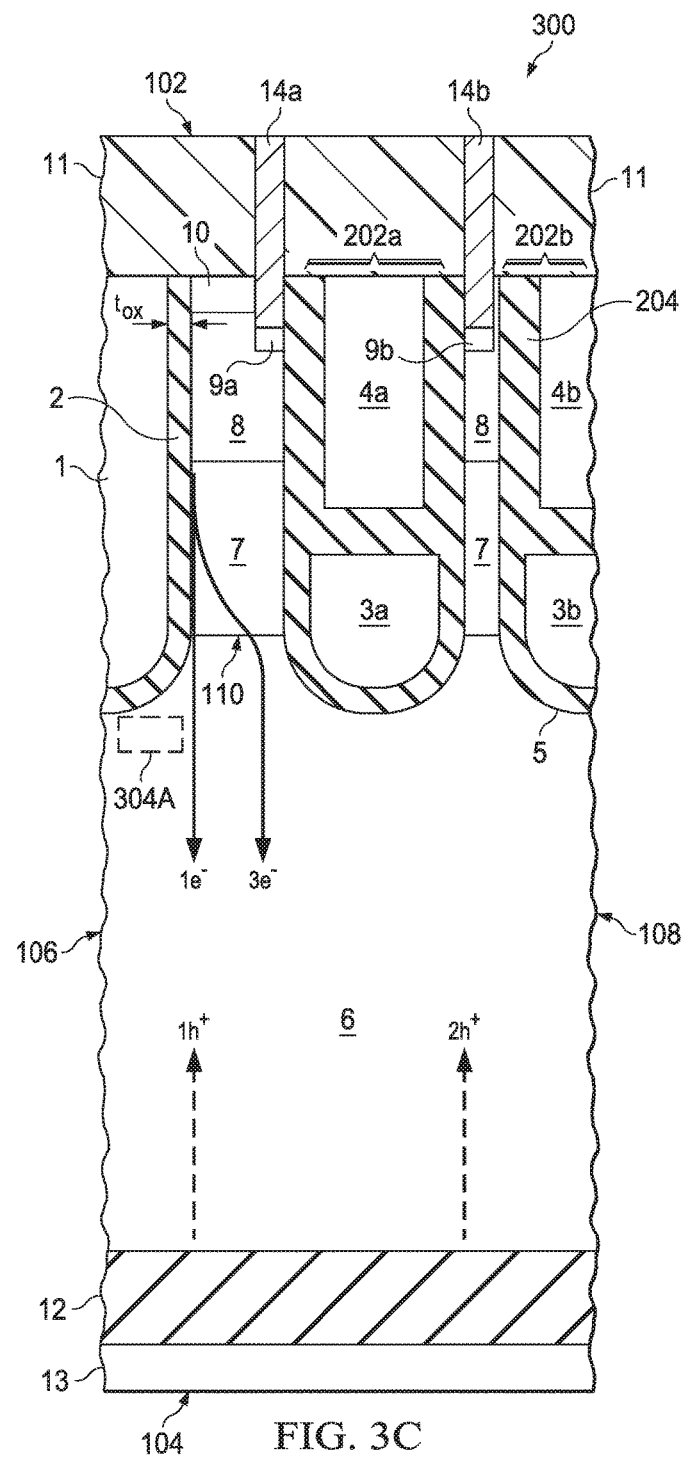
Figure 3D:
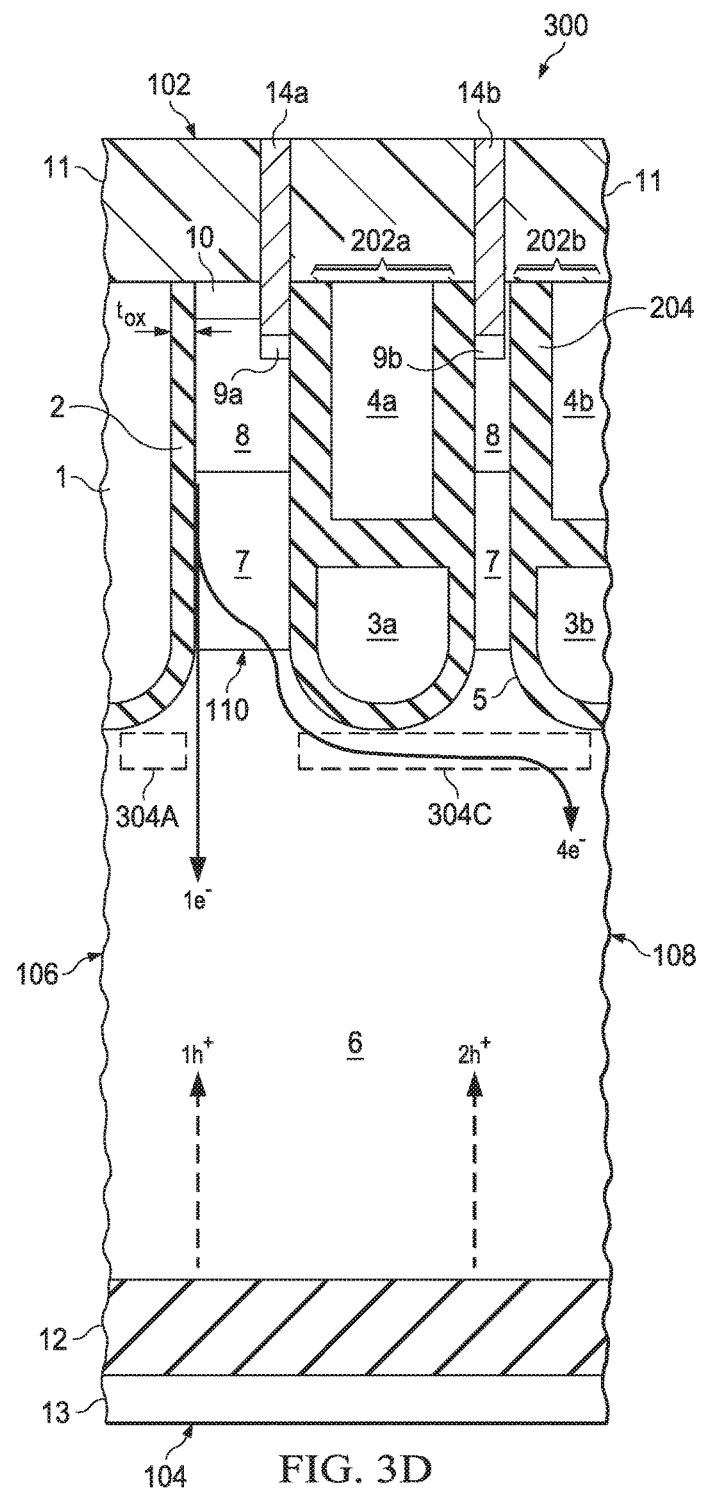

FIGS. 3B-3D are partial cross-sections of the AEGT 300 in FIG. 3A that illustrate electron and hole currents in various configurations of the AEGT 300. Some features illustrated in FIG. 2A are not shown in FIGS. 3B-3D for ease of illustration of the electron currents, hole currents, and accumulation zones. FIG. 3B shows the electron currents, hole currents, and accumulation zones which are generated when 3a is connected to a gate electrode and 3b is connected to an emitter. In particular, FIG. 3B illustrates electron paths $1e^-$, the active electron channel, and the second electron path $2e^-$, and two hole currents $1h^+$ and $2h^+$ that flow from the anode implant 13 into the drift region 6. In addition, FIG. 3B illustrates two accumulation zones 304A, formed under the active trench 1, and 304B, formed under 3a when 3a is connected to the gate electrode.

FIG. 3C illustrates currents when both 3a and 3b are connected to emitters. FIG. 3C shows two hole currents $1h^+$ and $2h^+$ that flow from the anode implant 13 into the drift region 6, the active electron channel $1e^-$, a single accumulation zone 304A, as well as a second electron current $3e^-$ which, in contrast to the electron current $2e^-$, does not extend into the area beneath 3a. Thus, there is no second accumulation zone in FIG. 3C.

FIG. 3D illustrates currents when both 3a and 3b are connected to gate electrodes. FIG. 3D shows two hole currents $1h^+$ and $2h^+$ that flow from the anode implant 13 into the drift region 6, the active electron channel $1e^-$, a first accumulation zone 304A, and a second electron current $4e^-$ which extends beneath both 3a and 3b, forming a second accumulation zone 304C beneath 3a and 3b.

Figure 4:
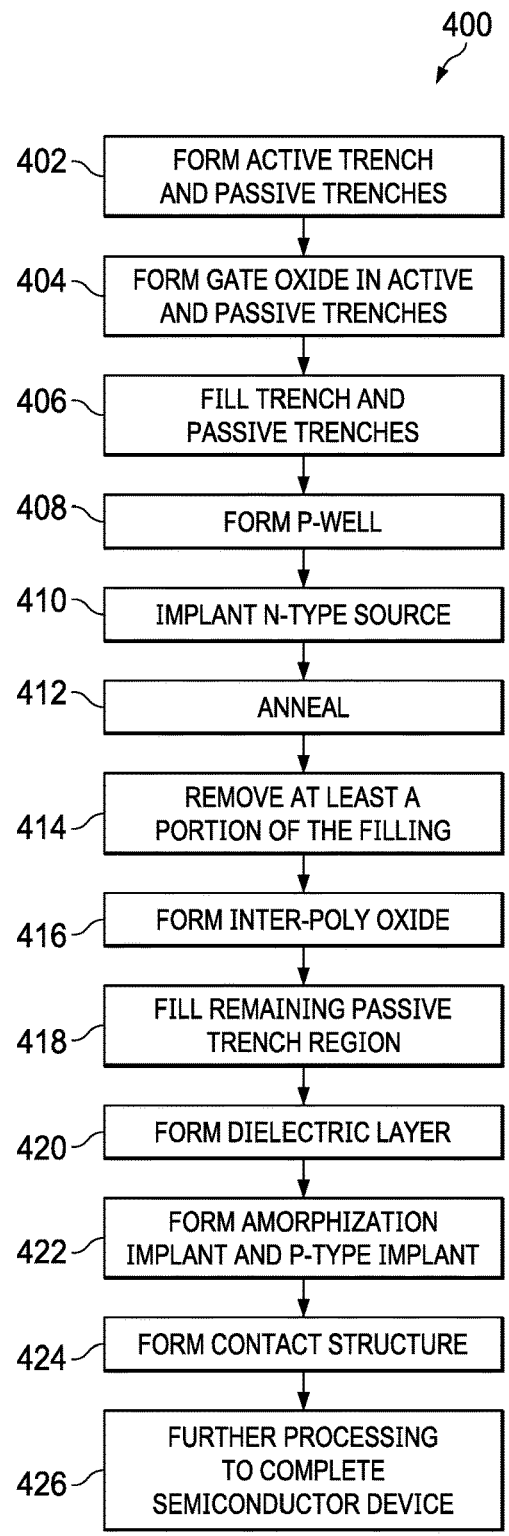
FIG. 4 is a flow chart of an embodiment of a partial method 400 of fabricating a semiconductor device according to certain embodiments of the present disclosure.

FIG. 4 is a flow chart of an embodiment of a partial method 400 of fabricating a semiconductor device. In the method 400, at block 402, an active trench and at least one plurality of passive trenches are formed in a JFET structure.

In an embodiment, a first passive trench of the plurality of passive trenches formed at block 402 is separated from the active trench to form a mesa, and each passive trench of the plurality of passive trenches is formed as to be separated from an adjacent passive trench by a predetermined distance, for example, of 1000 Å to 6000 Å. While a single active trench and a plurality of passive trenches are discussed herein, the plurality of passive trenches may be formed as a first plurality of passive trenches on a first side of the active trench, and as a second plurality of passive trenches on a second side of the active trench. At block 404, an oxide that may be referred to as a gate oxide is formed with a thickness from 300 Å to 3000 Å. The gate oxide formed at block 404 may be formed both on and in the active trench and the plurality of passive trenches formed at block 402 such that the gate oxide coats the interior of each trench, active or passive, with a substantially similar thickness, where "substantially similar" indicates that any difference in thickness of the gate oxide among and between trenches does not have a negative functional impact.

At block 406, the active trench and plurality of passive trenches are completely filled, e.g., from the bottom of each trench until the top of the trench that corresponds to a top surface of the device. In various embodiments, at block 406, the active trench and plurality of passive trenches may be filled with oxide, metal, polysilicon, or a dielectric material. The filling process may also be described as the formation of trench interiors referred to as filling layers as discussed above, and the formation of this filling layer may occur in a plurality of formation/deposition steps. In an embodiment, the filling layer for the trenches may be formed at block 406 over the entire surface of the device and etched back such that the filling layer takes up the entire volume of each of the passive and active trenches but is not disposed on a top region of the device itself.

In an embodiment, subsequent to the formation of the filling layer at block 406, a p-type region referred to as a p-well may be formed at block 408. At block 410, an n-type implant may be formed and may be formed in a p-well such that the NSRC implant is disposed below the gate oxide formed at block 404 and at the top of a p-well. The NSRC implant may be formed (implanted) at block 410 between the active trench and a passive trench, and may be subsequently activated using heat so that the implant reacts with the silicon matrix to make it an electrically active component of the semiconductor device. Subsequent to implantation of the NSRC implant, the structure may be annealed at block 412 to activate the NRSC implant formed at block 410.

In some embodiments, at block 414, at least a portion of the filing material disposed at block 406 is removed from the plurality of passive trenches. This removal at block 414 may be performed when the filling material disposed at block 406 is not an oxide, e.g., if it is a polysilicon, metal, or dielectric filling. In one example, if the filling comprises polysilicon, an etch-back (removal) of the polysilicon may occur such that the polysilicon remains in the seams and/or voids. Seams and/or voids may result from processing due to the properties of the gate oxide in the trenches. In some embodiments, subsequent to the removal at block 414, 5%-10% of the filling layer remains in each passive trench, and in alternate embodiments, 10%-25% of the filling layer remains in each passive trench. The filling layer remaining in each passive trench after the etchback at block 414 may measure from 0 microns to 5 microns.

In an embodiment, subsequent to the partial or total removal of the filler layers in the passive trenches at block 414, an inter-space oxide is formed via a thermal oxidation step at block 416 to form an inter-space oxide. The inter-space oxide may be from 3000 Å-8000 Å thick. This oxidation at block 416 forms a super trench that encompasses two or more passive trenches such that the super trench becomes a region that acts as a single trench structure and thus enables the formation of an accumulation layer in the silicon drift region below the trench.

In some embodiments, at block 418, if the filling material disposed at block 406 was not an oxide and was therefore at least partially removed from the plurality of passive trenches, a second filling of the plurality of passive trenches may occur at block 418. This filling may comprise polysilicon, metal, or dielectric material. This oxide formation at block 416 reduces the volume of the passive trenches. Thus, during the second filling step 418 of the passive trenches the amount deposited comprises less filling material than used during the initial filling of the passive trenches. This formation at block 418 may be performed such that the filler material comprises a thickness from about 1500 Å to about 3500 Å, and may comprise a subsequent annealing, for example, from 15-45 minutes at about 1000° C. This second filling step creates a structure as discussed herein, wherein a first filled portion of each passive trench is separated from a second filled portion of the trench by the layer of inter-space oxide.

The formation of the NSRC implant at block 410 and the p-well(s) at block 408 are done prior to the formation of the inter-space oxide at block 416 so that the inter-space oxide layer does not have to be removed before the formation of these elements. That is, the NSRC implant and p-well are formed prior to the formation of the inter-space oxide layer which saves both time and cost in the process and improves quality because there is no risk that the inter-space oxide layer could be damaged during formation of these other components.

At block 420, a dielectric layer is formed on top of the structure, and at block 422 an a p-type implant that may be referred to as a "P-ENH" implant may be formed in the p-well region. At block 424, a contact opening is formed and a contact that may comprise tungsten may be formed to abut the P-ENH implant, and at block 426 the structure may be further processed. The P-ENH implant may include an amorphization implant formed before the formation of the P-ENH implant and in an overlapping location with the P-ENH implant. The P-ENH implant may be employed to ensure contact with the p-well, and may be disposed and then the device may be subject to an anneal. The P-ENH implant is formed after the contact opening is formed and is positioned at the bottom of the contact such that the contact opening serves as the self-aligned mask for the P-ENH implant. The P-ENH implant serves to provide good (functional) contact to the p-well and to cut-off a parasitic electrical path to the NSRC region.

The further processing at block 426 may comprise the formation of a metallic layer such as an Al—Cu layer on top of the dielectric layer, and in some cases the formation of a passivation layer on top of the metallic layer. In some embodiments, the further processing at block 426 comprises forming a layer of a phosphosilica glass (PSG) on the structure to a thickness from about 3000 Å to about 6000 Å, and/or forming a tetraethyl orthosilicate (TEOS) layer by CVD to a thickness from 5000 Å to about 9000 Å on top of the PSG layer. The deposition of the PSG and the TEOS layers, followed in some cases by a densification step for about 30 minutes at about 950° C., form the pre-metal dielectric layer across the top of the device. In some embodiments, the formation of the dielectric layer at block 420 results in a surface of less than ideal smoothness. In this example, an oxide chemical/mechanical polish (CMP) step may be performed at block 426 in order to smooth and flatten the surface to allow further processing.

Figure 5A:
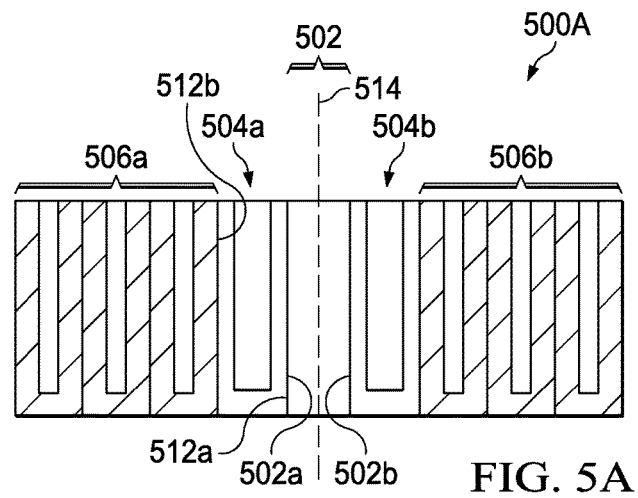
FIGS. 5A-5C illustrate alternate configurations of semiconductors including elements discussed in FIGS. 1A-1C, 2A-2D, and 3A-3D according to certain embodiments of the present disclosure.
Figure 5B:
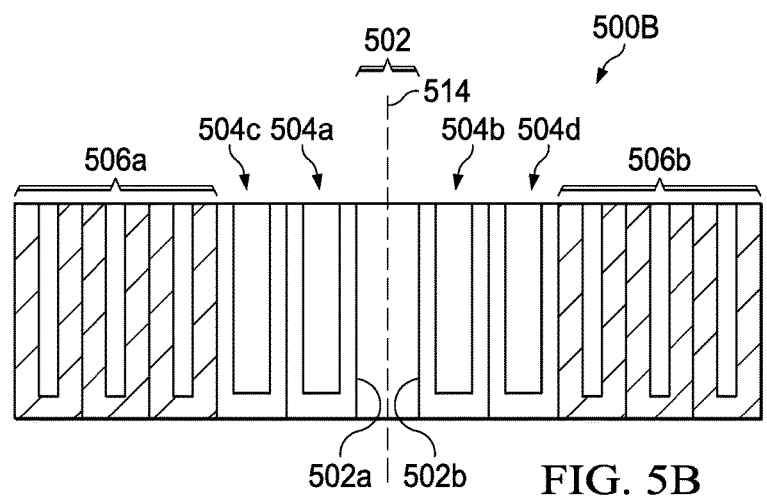
Figure 5C:
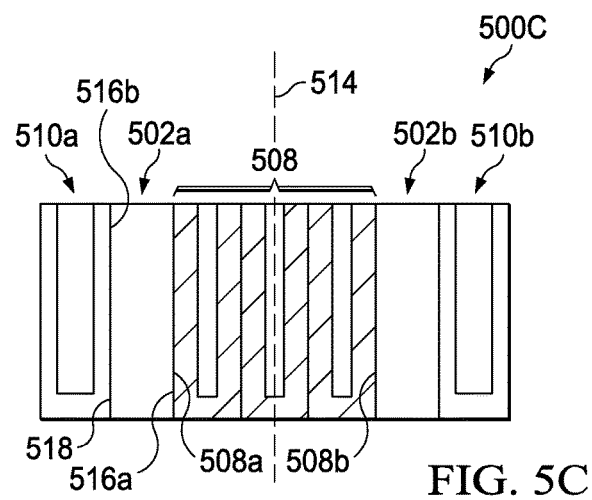

FIGS. 1A-1C, 2A-2D, and 3A-3D are partial schematic illustrations of embodiments of various configurations of active and passive trenches. FIGS. 5A-5C illustrate alternate configurations of elements including elements discussed in the above figures. FIG. 5A illustrates a first construction shown in FIGS. 1A-1C, 2A-2D, and 3A-3D. In particular, FIG. 5A shows a partial schematic cross-section 500A of a semiconductor device. The cross-section 500A shows a mesa 502 that abuts a first active trench 504a on a first side 502a of the mesa 502 and abuts a second active trench 504b on a second side 502b of the mesa. The first active trench 504a abuts a passive super trench 506a at a first side 512a of the first active trench 504a. And, in a similar fashion across the mirror axis 514, the second active trench 504b abuts a second passive super trench 506b. It is to be understood that mesas, active trenches, and passive trenches are described above in various configurations to enable component functionalities as gates or emitters, and that when these elements are "adjacent" and/or "abutting" each other, this means that the components are at least one of electrically or mechanically coupled in order to facilitate the formation of an electron path and accumulation regions as discussed in detail above. As FIGS. 5A-5C are partial schematics, it is also to be understood that there are additional components that may be present in the devices illustrated, and that these center-line configurations in FIGS. 5A-5C may be employed with various embodiments of those more detailed configurations as discussed above. Further, the super trenches discussed in FIGS. 5A-5C may be similar to those discussed in any of the FIGS. 1A-1C, 2A-2D, and 3A-3D.

FIG. 5B shows another embodiment of a partial schematic cross-section 500B of a semiconductor device. The cross-section 500B comprises a mesa 502 comprising a first side 502a and a second side 502b. The first side 502a is adjacent to a first active trench 504a and the second side 502b is adjacent to a second active trench 504b. The first active trench 504a comprises a first side 502a adjacent to the first active trench 502a and a second side 502b that is adjacent to a third active trench 504c. Similarly, in a mirrored configuration across the axis 514, a fourth active trench 504d is formed adjacent to a second passive super trench 506b and in between the second passive super trench 506b and the second active trench 504b. Further in this example, the third active trench 504c is in between a first passive super trench 506a and the first active trench 504a.

FIG. 5C shows another embodiment of a partial schematic cross-section 500C of a semiconductor device. The cross-section 500C comprises a passive trench 508 which may comprise a super trench 508. A first side 516a of a first mesa 502a is adjacent to the passive trench 508 on a first side 508a of the trench 508. A second side 516b of the first mesa 502a is adjacent to a first side 518 of a first active trench 510a. In a mirrored fashion across the central axis 514, a second mesa 502b is adjacent to the passive trench 508 at a second side 508b of the trench 508. The second mesa 502b is also adjacent to a second active trench 510b on a side opposite the interface of the second mesa 502b.

Exemplary embodiments are disclosed and variations, combinations, and/or modifications of the embodiment(s) and/or features of the embodiment(s) made by a person having ordinary skill in the art are within the scope of the disclosure. Alternate embodiments that result from combining, integrating, and/or omitting features of the embodiment(s) are also within the scope of the disclosure.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein. The scope of the claims shall include all equivalents of the subject matter of the claims. Unless expressly stated otherwise, the steps in a method claim may be performed in any order and with any suitable combination of materials and processing conditions.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u R-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A semiconductor structure comprising:
a first side opposite to a second side;
an anode region of a first conductivity type disposed on the second side and in contact with a buffer region of a second conductivity type opposite to the first conductivity type;
a drift region of the second conductivity type extending from the buffer region towards the first side;
an active trench comprising a first conductive fill material and a gate oxide layer surrounding a portion of the first conductive fill material;
a super trench comprising:
a plurality of individual passive trenches and formed adjacent to the active trench, separated from the active trench by a first mesa comprising a junction field effect transistor (JFET) region and a well region of the first conductivity type;
a second conductive fill material disposed within each passive trench of the plurality of individual passive trenches and a first dielectric layer surrounding a portion of the second conductive fill material;
a second dielectric layer formed on the first side over the super trench and the active trench
wherein the JFET region is in contact with the drift region and the well region is in contact with the second dielectric layer;
a source region of the second conductivity type in the well region; and
a first contact structure disposed through the second dielectric layer physically contacting the well region, the first contact structure disposed to be offset from a vertically oriented centerline of the first mesa without laterally overlapping the super trench in a cross-sectional view, wherein the second conductive fill material is electrically decoupled from the first contact structure.

2. The structure of claim 1, wherein the first mesa comprises a width from 50 nm to 10 μm.

3. The structure of claim 1 further comprising:
a third dielectric layer disposed above the second conductive fill material and at least partially surrounding a third fill material disposed within each passive trench of the plurality of individual passive trenches, wherein the first contact structure does not physically contact the third fill material in the cross-sectional view.

4. The structure of claim 3, wherein the second conductive fill material is wider than the third fill material in the cross-sectional view.

5. The structure of claim 3, wherein:
the third fill material comprises a third conductive fill material; and
the first contact structure adjoins a sidewall of a passive trench closest to the active trench and is laterally separated and electrically isolated from the third conductive fill material by the third dielectric layer.

6. The structure of claim 3, wherein:
the second conductive fill material is thinner than the first conductive fill material in the cross-sectional view; and
the third fill material comprises a dielectric material.

7. The structure of claim 1, wherein the second conductive fill material is electrically coupled to the first conductive fill material to provide the semiconductor structure configured to form an accumulation region adjacent a lower surface of the super trench.

8. The structure of claim 1, further comprising:
a plurality of second mesas each disposed between a pair of passive trenches, where the plurality of second mesas each have a width that is less than that of the first mesa.

9. The structure of claim 8, wherein:
each second mesa comprises a second well region of the first conductivity type, but is provided absent any source regions of the second conductivity type.

10. The structure of claim 9, further comprising:
a second contact structure electrically coupled to at least one of the second mesas.

11. A semiconductor structure comprising:
a first side opposite to a second side;
an anode region of a first conductivity type disposed on the second side and in contact with a buffer region of a second conductivity type opposite to the first conductivity type;
a drift region of the second conductivity type extending from the buffer region towards the first side;
an active trench comprising a first conductive fill material, and a gate oxide layer surrounding a portion of the first conductive fill material;
a plurality of passive trenches formed adjacent to the active trench and configured to act as a single passive trench,
wherein each passive trench of the plurality of passive trenches comprises a bottom dielectric in contact with a first electrode region, wherein the first electrode region is separated from a second electrode region of the passive trench by an inter-space dielectric,
wherein a first passive trench of the plurality of passive trenches is separated from the active trench by a first mesa and the first passive trench is separated from an adjacent passive trench of the plurality of passive trenches by a second mesa, and
wherein the first mesa and the second mesa each comprise a junction field effect transistor (JFET) region and a well region of the first conductivity type;
a first source region of the second conductivity type formed in the well region of the first mesa;
a first doped region of the first conductivity type formed in the well region of the first mesa and electrically connected to a first emitter;
a dielectric layer formed on the first side over the plurality of passive trenches and the active trench, wherein the JFET region is in contact with the drift region and the well region is in contact with the dielectric layer, wherein:
the first electrode region of at least one passive trench is electrically coupled to the first conductive fill material and electrically decoupled from the first emitter such that an accumulation region is formed adjacent to a bottom surface of the least one passive trench during activation of the semiconductor structure.

12. The structure of claim 11, wherein the second mesa comprises a second doped region of the first conductivity type formed in the well region and electrically connected to a second emitter.

13. The structure of claim 11, wherein the second mesa is devoid of any source regions of the second conductivity type.

14. The structure of claim 11, wherein the first electrode region of a least two passive trenches is electrically coupled to the first conductive fill material and electrically decoupled from the first emitter such that an accumulation region is formed adjacent to bottom surfaces of the least two passive trenches during activation of the semiconductor structure.

15. The structure of claim 11, wherein:
the first emitter is disposed to physically contact the first doped region within the well region in a position that is offset from a vertically oriented centerline of the first mesa.

16. The structure of claim 15, wherein:
the first emitter is electrically decoupled from the both the first electrode region and the second electrode region.

17. A semiconductor structure comprising:
a first side opposite to a second side;
an anode region of a first conductivity type disposed on the second side and in contact with a buffer region of a second conductivity type opposite to the first conductivity type;
a drift region of the second conductivity type extending from the buffer region towards the first side;
an active trench comprising a first conductive fill material and a gate oxide layer surrounding a portion of the first conductive fill material;
a super trench comprising:
a plurality of individual passive trenches and formed adjacent to the active trench, separated from the active trench by a first mesa comprising a junction field effect transistor (JFET) region and a well region of the first conductivity type;
a second conductive fill material disposed within each passive trench of the plurality of individual passive trenches, the second conductive fill material recessed below the first side and a first dielectric layer surrounding at least a portion of the second conductive fill material; and
a dielectric region formed on the first side and disposed within the plurality of individual passive trenches above the second conductive fill material;
a source region of the second conductivity type in the well region;
a dielectric layer disposed adjacent the first side and disposed to overlap the super trench and the active trench; and
a contact structure disposed through the dielectric layer physically contacting the well region, wherein:
the second conductive fill material is electrically coupled to the first conductive fill material to provide the semiconductor structure configured to form an accumulation region adjacent a lower surface of the super trench.

18. The structure of claim 17, wherein the contact structure is disposed to be offset from a centerline of the first mesa.

19. The structure of claim 17, wherein the contact structure adjoins a sidewall of a passive trench closest to the active trench and is laterally separated and electrically isolated from the second conductive fill material by the dielectric region.

20. The structure of claim 17, wherein the second conductive fill material is thinner than the first conductive fill material.

* * * * *